United States Patent [19]
Kizuki et al.

[11] Patent Number: 5,882,952
[45] Date of Patent: Mar. 16, 1999

[54] SEMICONDUCTOR DEVICE INCLUDING QUANTUM WELLS OR QUANTUM WIRES AND METHOD OF MAKING SEMICONDUCTOR DEVICE

[75] Inventors: Hirotaka Kizuki; Motoharu Miyashita, both of Tokyo, Japan

[73] Assignee: Mitsubishi Denki Kabushiki Kaisha, Tokyo, Japan

[21] Appl. No.: 895,824

[22] Filed: Jul. 17, 1997

[30]     Foreign Application Priority Data

Jan. 7, 1997 [JP] Japan ................................. 9-000661

[51] Int. Cl.$^6$ .................................................. H01L 29/06
[52] U.S. Cl. ................... 438/47; 438/962; 257/9; 257/12; 372/45
[58] Field of Search .............................. 438/962, 47, 172; 257/9, 11, 12; 372/45

[56]           References Cited

FOREIGN PATENT DOCUMENTS

| | | |
|---|---|---|
| 2238674 | 9/1990 | Japan . |
| 621564 | 1/1994 | Japan . |

OTHER PUBLICATIONS

K. Inoue, et al. "Composition Modulation in Quantum Wire Structures on Vicinal (110) GaAs Studied by Photoluminescence." *Japanese Journal of Applied Physics* vol. 34 (Feb. 1995) Part 1, No. 2B, pp. 1342–1344.

S. Hara, et al. "Quantum Well Wire Fabrication Method Using Self–Organized Multiatomic Steps on Vicinal (001) GaAs Surfaces by Metalorganic Vapor Phase Epitaxy." *Japanese Journal of Applied Physics* vol. 34, (Aug. 1995) Part 1, No. 8B, pp. 4401–4404.

S. Hara et al., "Formation and photoluminescence characterization of quantum well wires using multiatomic steps grown by metalorganic vapor phase epitaxy", J. Crystal Growth 145, pp. 692–697 (no month given), 1994.

K. Inoue et al., "Composition modulation in quantum wire structures on vicinal (110) GaAs studied by photoluminescence", J. J. Appl. Phys. 34, pp. 1342–1344, Feb. 1995.

S. Hara et al., "Quantum well wire fabrication method using self–organized mutiatomic steps on vicinal (001) GaAs surfaces by metalorganic vapor phase epitaxy", J. J. Appl. Phys. 34, pp. 4401–4404, Aug. 1995.

*Primary Examiner*—Charles Bowers
*Assistant Examiner*—Keith Christianson
*Attorney, Agent, or Firm*—Leydig, Voit & Mayer

[57]           ABSTRACT

A method of fabricating a semiconductor device includes: forming multiatomic steps by MOCVD on a (110) semiconductor substrate inclined at an angle toward the [$00\overline{1}$] direction or the [$1\overline{11}$] direction; and growing at least one double heterostructure including a first compound semiconductor and a second compound semiconductor having a smaller band gap than the first compound semiconductor to form quantum wires of the second compound semiconductor at edges of the multiatomic steps. Multiatomic steps having step edges along the longitudinal direction of the wire have improved linearity, and thus, quantum wires can be fabricated with improved controllability.

7 Claims, 12 Drawing Sheets

Fig.2
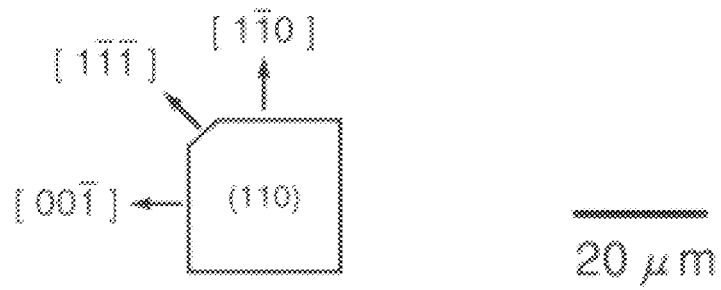
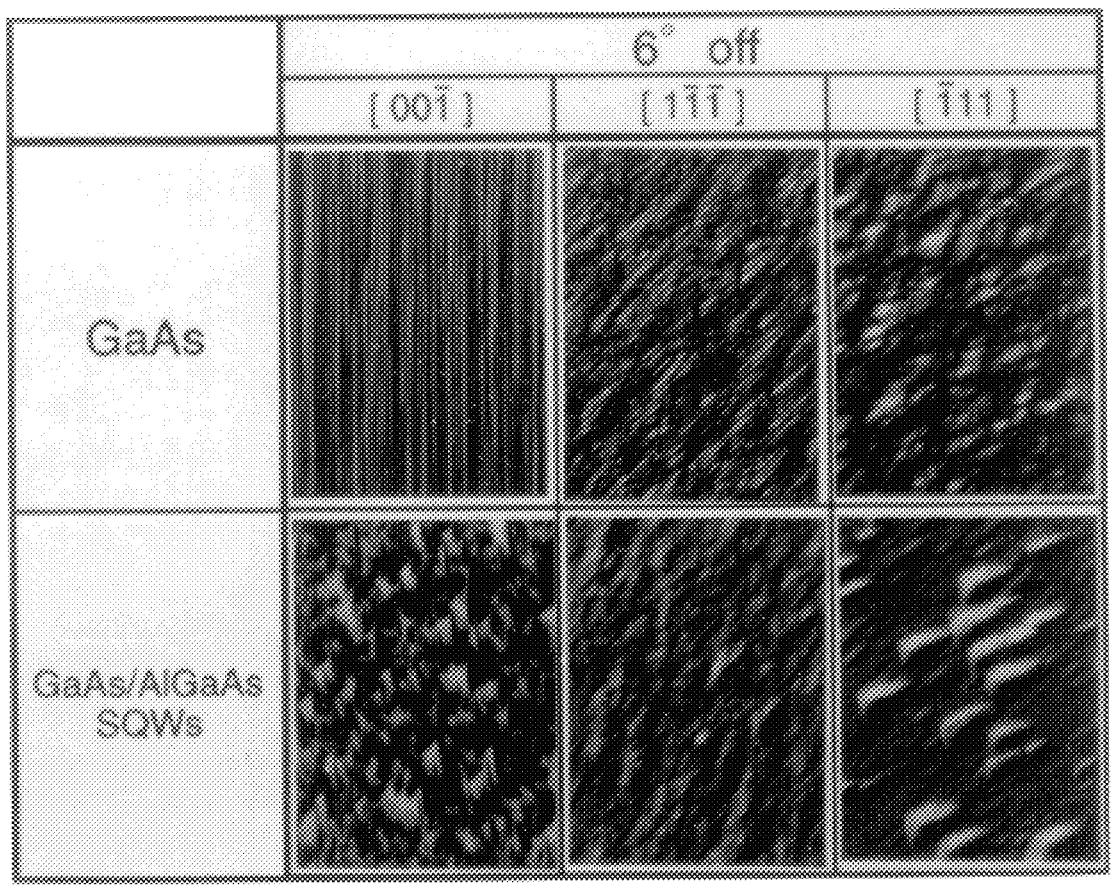

Fig.3
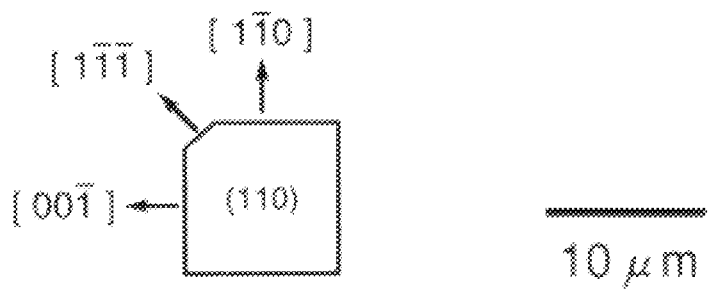
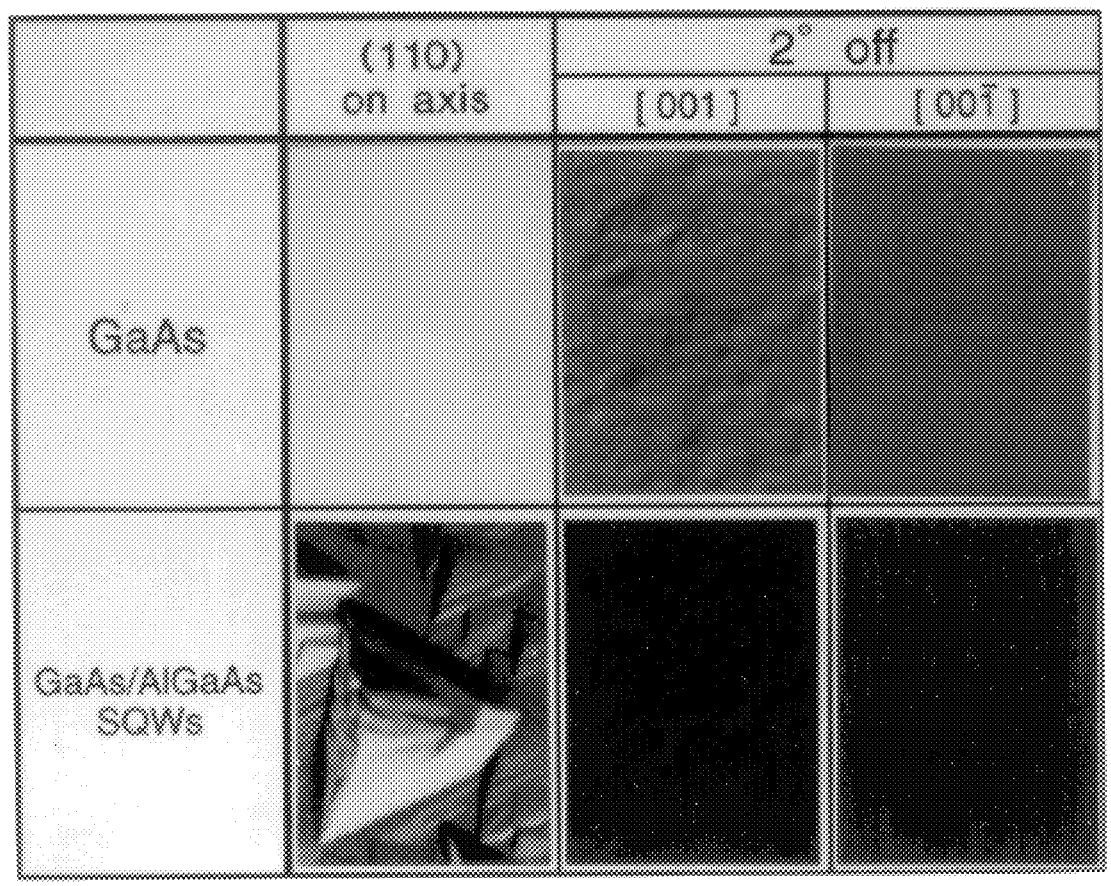

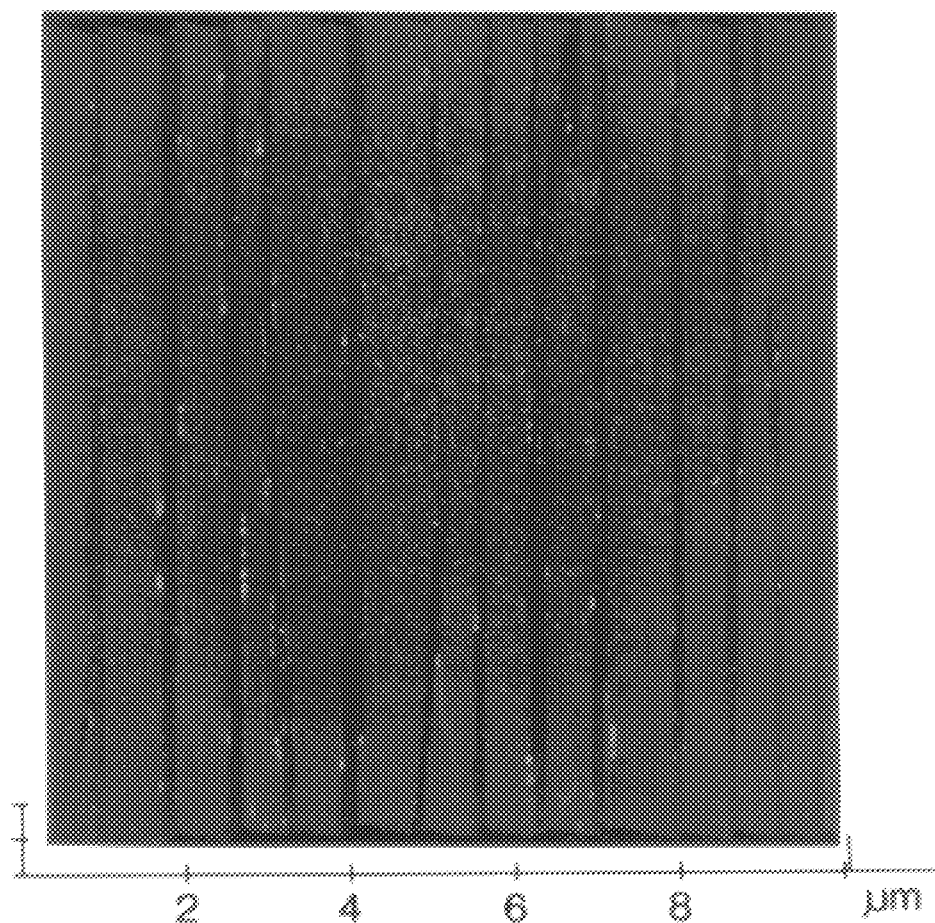

━━ 10 μm

━━ 5 μm

Light Output

SEMICONDUCTOR DEVICE INCLUDING QUANTUM WELLS OR QUANTUM WIRES AND METHOD OF MAKING SEMICONDUCTOR DEVICE

FIELD OF THE INVENTION

The present invention relates to a method of fabricating a semiconductor device and a semiconductor device and, more particularly, to a method of fabricating quantum wires and quantum wells of good quality on a (110) substrate and a semiconductor device including the quantum wires and quantum wells fabricated by the aforesaid method.

BACKGROUND OF THE INVENTION

In recent years, methods for fabricating self-organized quantum wires and quantum dots have been actively researched. Self-organization represents a method of forming self-aligned three-dimensional structures such as a quantum wire or a quantum dot, utilizing mainly the mechanism of crystal growth. By employing quantum wires and quantum wells in active regions of devices, tremendous improvement of device properties, for example, a great reduction in threshold current in a semiconductor laser can be expected. In addition, self-organization attracts much attentions as a method of fabricating low damage and high quality quantum wires or quantum dots.

FIG. 10(a) is a cross-sectional view explaining a prior art method of fabricating a self-organized quantum wire, for example, reported by Koichi Inoue, et. al., Jpn. J. Appl. Phys. vol. 34 (1995), p. 1342. This diagram illustrates a section of a sample in which a GaAs/AlGaAs multilayer structure is grown by molecular beam epitaxy (MBE) on a GaAs substrate having an orientation of (110) inclined by 6° or 3° toward the [001] direction.

Generally, on such a vicinal GaAs substrate surface, atomic steps of two monolayers are formed at intervals in accordance with the inclination angle of the substrate. However, when the GaAs/AlGaAs multilayer structure is grown on this substrate by MBE, it is found that atomic steps are assembled with their growths to form multiatomic steps each having a terrace width of about 100 nm and a step height of 10 to 20 nm, as shown in the figure. This diagram illustrates a sample in which when an AlAs/Al$_{0.2}$Ga$_{0.8}$As/AlAs sandwich structure is formed after formation of five periods of GaAs/Al$_{0.5}$Ga$_{0.5}$As periodic structure, Al$_{0.2}$Ga$_{0.8}$As quantum wires are formed at the step edges. The quantum wire fabricated in the above manner has a characteristic that the light refractive index is lower at inclined regions and higher at flat regions of the step edges, and is applicable to an active layer of a laser or the like.

FIG. 11 is a cross-sectional view of quantum wire structures fabricated by another conventional method of fabricating quantum wires which is, for example, reported Shinjiroh Hara et al., Jpn. J. Appl. Phys. vol. 34 (1995) p. 4401. In this prior art example, the structure shown in the figure is grown on a substrate having a (001) surface inclined 5° toward the [$\bar{1}$10] direction, by metalorganic chemical vapor deposition (hereinafter also referred to as MOCVD) to form quantum wires comprising an AlAs/GaAs/Al$_{0.35}$Ga$_{0.65}$As sandwich structure.

In either of the above two examples, multiatomic steps are formed using a vicinal substrate, and on the steps, quantum wires are self-organizingly formed by skillfully controlling slight differences in growth habit on the multiatomic steps between GaAs and AlGaAs.

The prior art methods for fabricating self-organized quantum wires described above have the following problems.

(1) For example, if GaAs growth employing a (110) vicinal substrate with the [001] direction as the inclination direction for the substrate is performed by MOCVD, multiatomic steps cannot be formed due to the difference in crystal growth habit between MBE and MOCVD, and surface roughness occurs, thereby making the fabrication of a quantum wire difficult.

(2) Since the growth conditions for which good quality multiatomic steps are formed by GaAs and AlGaAs have not been determined quantitatively yet, the stable formation of quantum wires is difficult.

(3) The growth in the crystal growth process is not sufficiently uniform for a minute structure like a quantum wire. Accordingly, a surface condition as shown in FIG. 10(b) occurs, making it difficult to form step edges with good linearity in the longitudinal direction of the quantum wire.

SUMMARY OF THE INVENTION

It is an object of the present invention to provide a a semiconductor device in which quantum wires are formed with good controllability, and which can produce improved operation characteristics using quantum wires.

It is another object of the present invention to provide fabrication method for fabricating such a semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method of fabricating a semiconductor device comprises: fabricating multiatomic steps by metalorganic chemical vapor deposition on a semiconductor substrate with a (110) surface inclined at a predetermined angle toward the [00$\bar{1}$] direction or the [1$\bar{1}$1] direction; and then subsequently forming at least one double heterostructure comprising a first compound semiconductor and a second compound semiconductor having a smaller band gap than that of the first semiconductor so as to form quantum wires comprising the second compound semiconductor at the step edges of the multiatomic steps. As the [00$\bar{1}$] direction or the [1$\bar{1}$1] direction is adopted as the inclination direction of the (110) vicinal substrate on which self-organized quantum wires are fabricated, multiatomic steps having step edges formed along the longitudinal direction of the wire with improved linearity can be formed, whereby quantum wires can be formed with good controllability.

According to a second aspect of the present invention, in the method of fabricating a semiconductor device in accordance with the first aspect, the first compound semiconductor comprises Al$_x$Ga$_{1-x}$As and the second compound semiconductor comprises GaAs.

According to a third aspect of the present invention, in the method of fabricating a semiconductor device in accordance with the second aspect, the first compound semiconductor comprises Al$_x$Ga$_{1-x}$As and the second compound semiconductor comprises Al$_y$Ga$_{1-y}$As (x>y).

According to a fourth aspect of the present invention, in the method of fabricating a semiconductor device in accordance with the first aspect, the first compound semiconductor is grown on the multiatomic steps at a first growth temperature so that difference in step size due to the first growth does not occur, and then the second compound semiconductor is grown at the step edges of the multiatomic steps comprising the first compound semiconductor at a second growth temperature at which the difference in step size due to the second growth is large. By utilizing the fact that the temperature at which step size varies remarkably with crystal growth material to fabricate quantum wires and quantum wells respectively, quantum wires and quantum wells can be formed effectively and quantitatively.

In a method of fabricating a semiconductor device according to a fifth aspect of the present invention, gas etching is performed on a (110) semiconductor substrate inclined at a predetermined angle toward the [00$\bar{1}$] direction or the [1$\bar{1}\bar{1}$] direction to form a quantum well structure, and the growth temperature for the well layers comprising GaAs is about 50° C. lower than that for the barrier layer comprising AlGaAs.

According to a sixth aspect of the present invention, a method of fabricating a semiconductor device comprises: performing gas etching on a (110) semiconductor substrate inclined at a predetermined angle toward the [00$\bar{1}$] direction to form multiatomic steps; and then subsequently growing at least one double heterostructure comprising a first compound semiconductor and a second compound semiconductor having a smaller band gap than that of the first compound semiconductor by metalorganic chemical vapor deposition to form quantum wires comprising the second compound semiconductor at the step edges of the multiatomic steps. As the gas etching is performed at the same atmosphere temperature and pressure as those in the crystal growth, a mechanism which is a reverse of the crystal growth mechanism occurs. Therefore, the step size of the multiatomic steps can be controlled by taking advantage of this phenomenon, so that quantum wires having good linearity in longitudinal direction and small variations in step height can be formed.

According to a seventh aspect of the present invention, a semiconductor device comprises an active layer comprising quantum wires obtained by forming at least one double heterostructure comprised of a first compound semiconductor and a second compound semiconductor with a smaller band gap than that of the first compound semiconductor on a (110) semiconductor substrate inclined at a predetermined angle toward the [00$\bar{1}$] direction or the [1$\bar{1}\bar{1}$] direction. The application of the quantum wires realizes improvement easily in characteristics of respective semiconductor devices; for example, the application to a laser makes a low-threshold laser possible, and the application to a field effect transistor realizes a very-high-speed device.

BRIEF DESCRIPTION OF THE DRAWINGS

FIG. 2 shows microphotographs of a quantum well structure for explaining a method of fabricating a semiconductor device according to the first embodiment, the quantum well structure being comprised of GaAs and GaAs/AlGaAs and grown on a GaAs substrate having a (110) plane orientation and an inclination angle of 6°, by MOCVD.

FIG. 3 shows microphotographs of a quantum well structure for explaining a method of fabricating a semiconductor device according to the first embodiment, the quantum well structure being comprised of GaAs and GaAs/AlGaAs and grown on a GaAs substrate having a (110) plane orientation and an inclination angle of 2°, by MOCVD.

DETAILED DESCRIPTION OF THE PREFERRED EMBODIMENTS

Embodiment. 1

Figure 1:
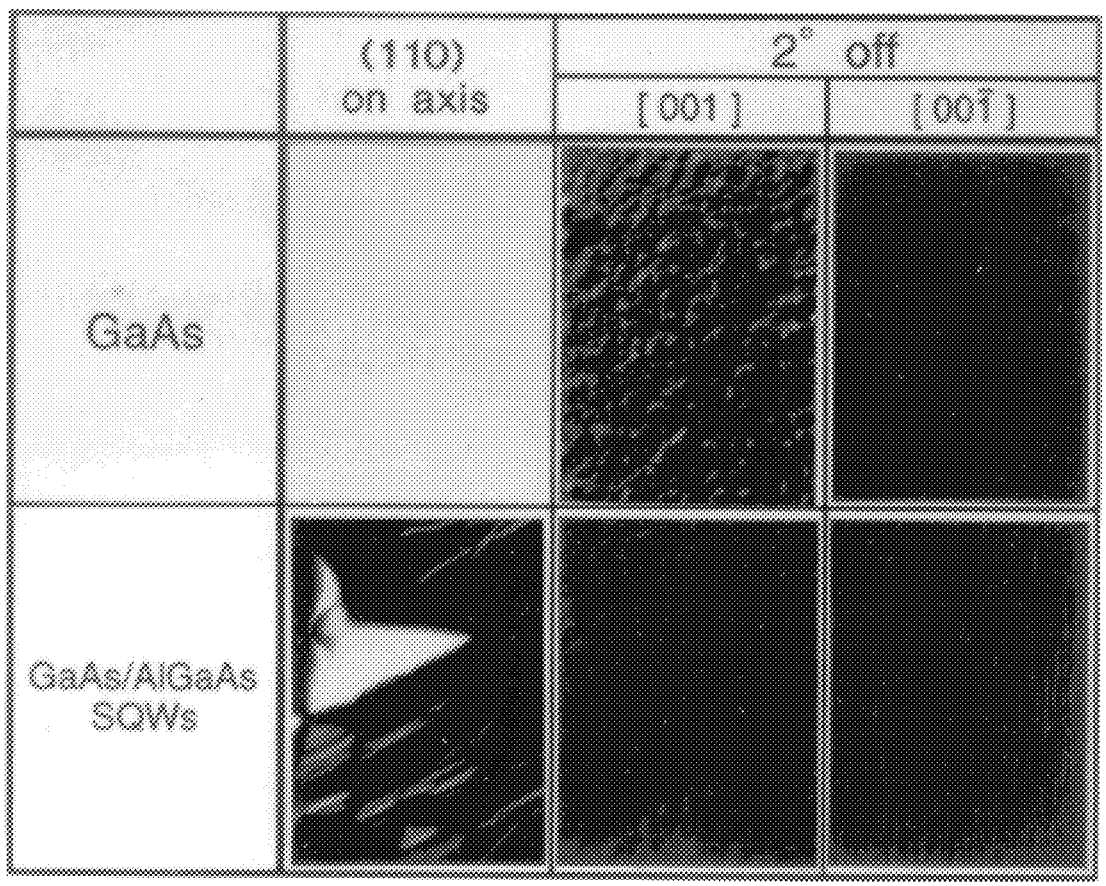
FIG. 1 shows microphotographs of a quantum well structure for explaining a method of fabricating a semiconductor device according to a first embodiment, the quantum well structure being comprised of GaAs and GaAs/AlGaAs and grown on a GaAs substrate having a (110) plane orientation and an inclination angle of 2°, by MOCVD.
Figure 4:
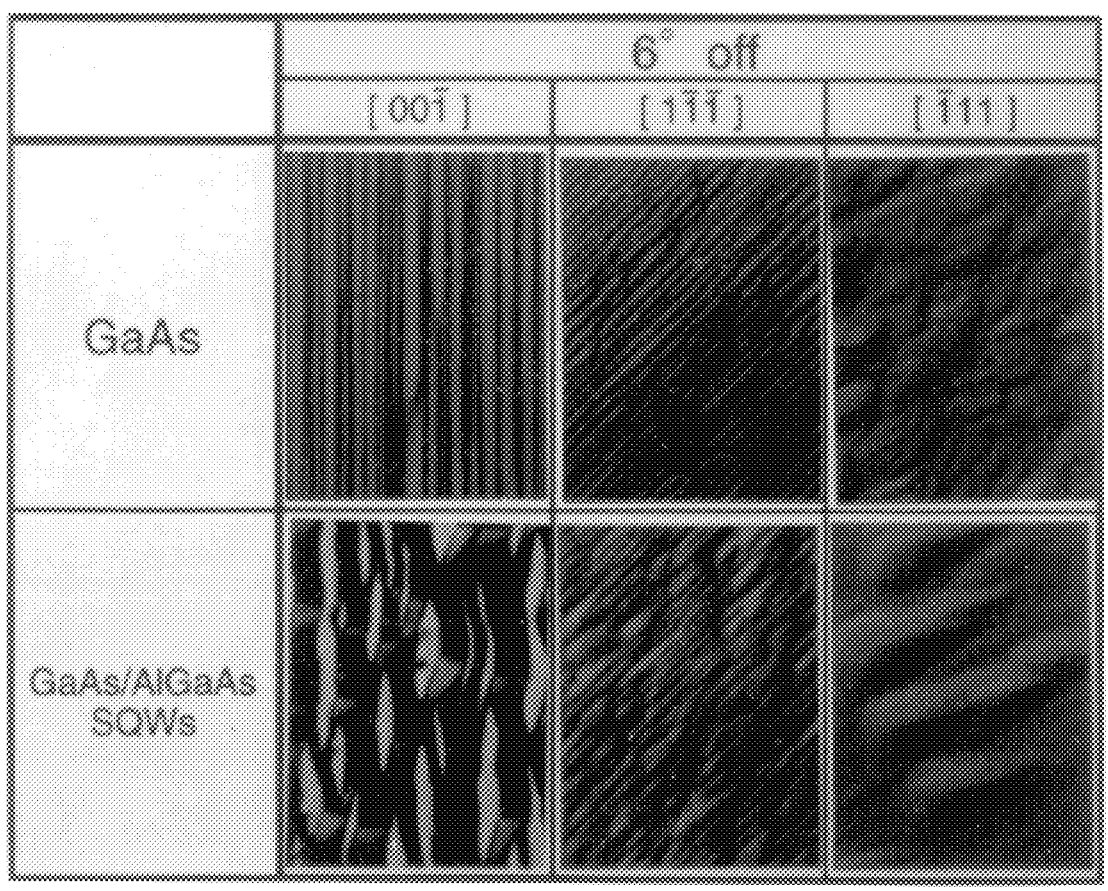
FIG. 4 shows microphotographs of a quantum well structure for explaining a method of fabricating a semiconductor device according to the first embodiment, the quantum well structure being comprised of GaAs and GaAs/AlGaAs and grown on a GaAs substrate having a (110) plane orientation and an inclination angle of 6°, by MOCVD.

FIGS. 1 and 2 are microphotographs showing the states of surface of a GaAs and GaAs/AlGaAs quantum well structure formed on a (110) vicinal GaAs substrate by metalorganic chemical vapor deposition for explaining a method of fabricating a semiconductor device according to a first embodiment. During the formation, the crystal growth temperature is 700° C., and the pressure is 100 Torr. FIG. 1 illustrates the states of crystal growth in the respective plane orientations when the inclination angle of the substrate is 2°, and FIG. 2 illustrates the states of crystal growth in the respective plane orientations when the inclination angle of the substrate is 6°. From these photographs, it is found that the states of the surfaces of the crystals vary greatly according to the inclination directions and the inclination angles. FIGS. 3 and 4 are microphotographs of the same samples shown in FIGS. 1 and 2 photographed by a microscope of its increased magnification. From these photographs, the following facts are revealed.

When GaAs growth is performed using a substrate inclined toward the [001] direction, surface roughness occurs. On the other hand, when the growth is performed using a substrate inclined toward the [00$\bar{1}$] direction, a sample having an inclination angle of 2° has a relatively flat surface morphology and, in the case of a sample having an inclination angle of 6°, formation of multiatomic steps can be clearly recognized.

In the observation by atomic force microscopy (AFM), it is recognized that multiatomic steps each comprising several monolayers have been grown in the case of the sample having the inclination angle of 2°.

When multiatomic steps are formed on a substrate inclined toward the [00$\bar{1}$] direction, step edges extending linearly more than 20 μm in length are formed.

Moreover, in the case of the sample inclined toward the [1$\bar{1}\bar{1}$] direction, formation of multiatomic steps can be clearly recognized along the direction perpendicular to the inclination direction.

From the above analyses, the following matters are revealed. To be more specific, in the prior art method, definite multiatomic steps cannot be obtained by MOCVD growth when using a vicinal substrate inclined toward the [001] direction which is used in the MBE growth method; only the substrate inclined toward the [00$\bar{1}$] direction or the [1$\bar{1}\bar{1}$] direction allows formation of multiatomic steps by MOCVD growth. Therefore, when quantum wires are formed by MOCVD growth using a (110) vicinal substrate, the inclination direction is limited to the [00$\bar{1}$] direction or the [1$\bar{1}\bar{1}$] direction.

Hence, in the first embodiment, as quantum wires are formed by MOCVD growth using a (110) vicinal substrate having an inclination direction in the [00$\bar{1}$] direction or the [1$\bar{1}\bar{1}$] direction, multiatomic steps having step edges formed along the longitudinal direction of the wire with improved linearity can be fabricated, and thus formation of quantum wires can be realized with good controllability.

Embodiment. 2

Figure 5:
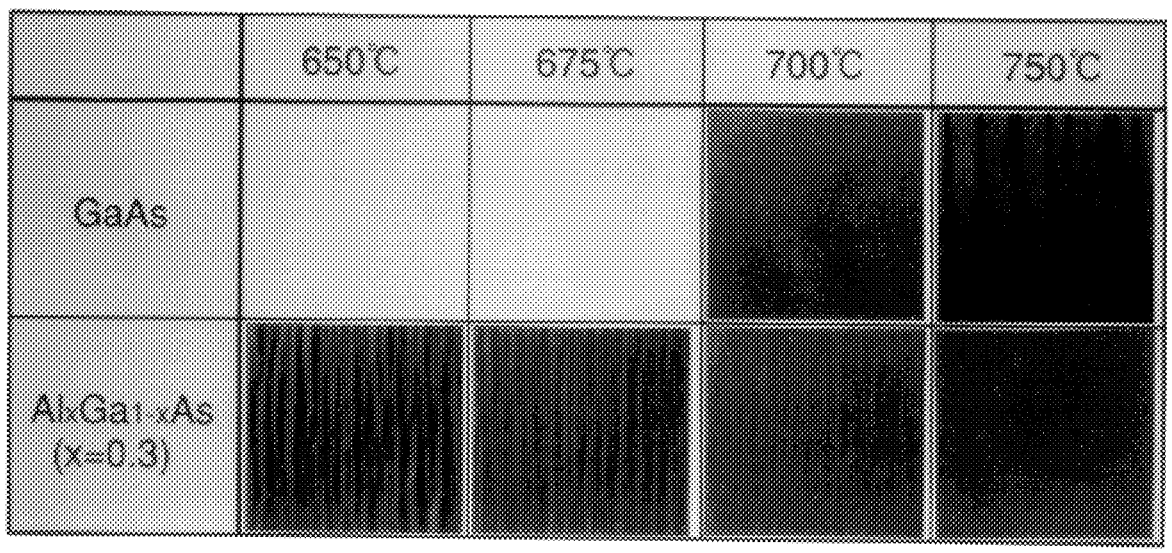
FIG. 5 shows microphotographs of surface states of GaAs and GaAs/AlGaAs for explaining a method of fabricating a semiconductor device according to a second embodiment, the GaAs and GaAs/AlGaAs being grown on a (110) GaAs substrate inclined 2° toward the [00$\bar{1}$] direction.

FIG. 5 illustrates microphotographs for explaining a method of fabricating a semiconductor device according to a second embodiment. These photographs were taken using a microscopy for observing states of the surfaces when GaAs and AlGaAs are grown on a (110) GaAs substrate inclined 2° toward the [00$\bar{1}$] direction. At this time, the crystal growth temperature is varied from 650° C. to 750° C. for comparison of the states of surfaces at under the respective temperatures. The pressure is 100 Torr, the flow rate of trimethylgallium (TMG) is $2\times10^{-5}$ mol/min, the flow rate of AsH$_3$ is $9\times10^{-3}$ l/min, and the flow rate of H$_2$ is 10 l/min.

When GaAs is grown at a growth temperature of 700° C. as in the first embodiment, multiatomic steps each comprising several monolayers are formed as described above but the steps formed by the growth are almost flat. On the other hand, when the growth is performed at a temperature of 750° C., formation of extremely large multiatomic steps are recognized as shown in FIG. 5. The terrace width of the step is 3 to 5 μm, and the step height is about 0.1 to 0.2 μm. The growth at a temperature higher than the aforesaid temperature might cause surface roughness in view of the crystal growth characteristics of GaAs.

In the second embodiment a GaAs layer is grown to a thickness of about 2 μm and, as the thickness becomes thinner, the terrace width and the step height are reduced, respectively. As a result, it is confirmed that the step height and terrace width of the multiatomic steps can be controlled by controlling the growth temperature and the growth thickness.

On the other hand, when AlGaAs is grown on a (110) GaAs substrate inclined 2° toward the [00$\bar{1}$] direction as described above, formation of definite multiatomic steps is recognized at a growth temperature of 650° C.; however, the grown steps become flatter with an increase in growth temperature and at 750° C., almost flat steps are realized.

Figure 6:
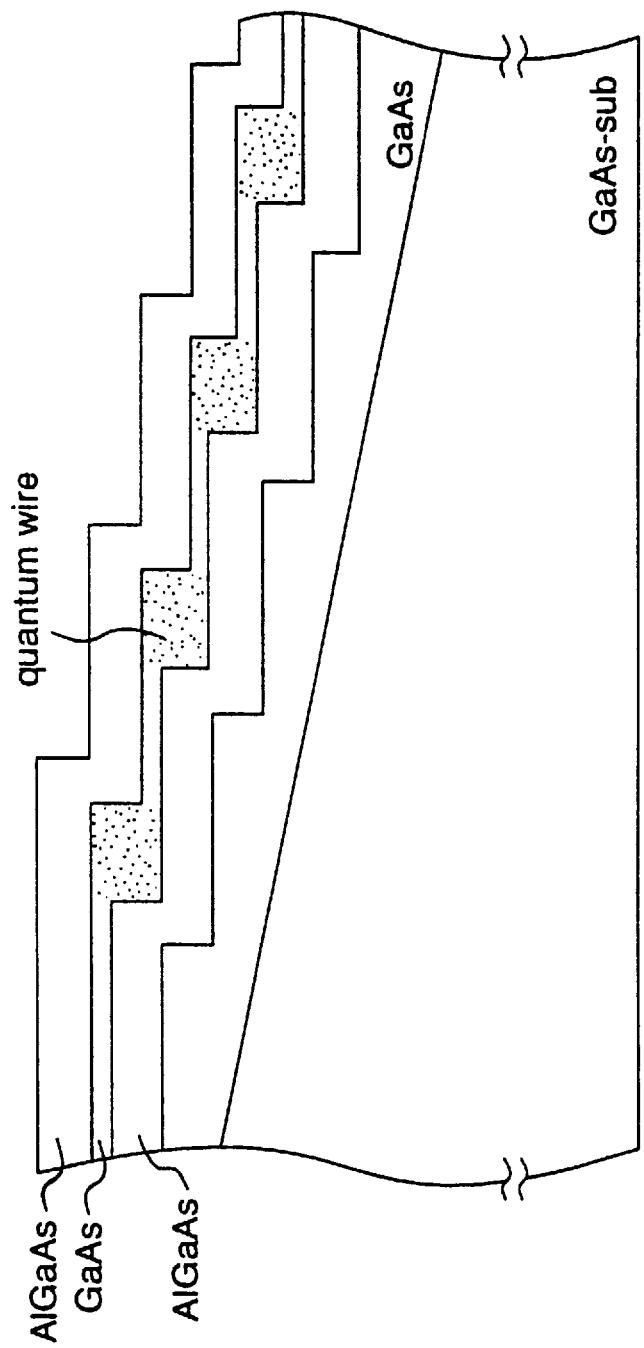
FIG. 6 is a cross-sectional view illustrating structures of quantum wires formed by a method of fabricating a semiconductor device according to the second embodiment of the present invention.

From the above analyses, the following matters can be confirmed. Initially, a GaAs buffer layer is grown on a GaAs substrate at a growth temperature of 750° C. Then, an AlGaAs barrier layer is grown at the same temperature, and a GaAs well layer and an AlGaAs barrier layer are subsequently grown at the above temperature. In this structure, the GaAs layer alone can have the proper conditions so that large multiatomic steps are formed, and quantum wires having the shape shown in FIG. 6 can be formed with stability.

From the above description, it is found that when the growth is performed on a (110) GaAs substrate inclined 2° toward the [00$\bar{1}$] direction, the temperature at which flat steps are realized differs between GaAs and AlGaAs. In other words, a quantum well structure cannot be grown at the same growth temperature as in the fabrication of the quantum wires. To be more specific, when a well layer (GaAs) is grown at a growth temperature of 700° C. and a barrier layer (AlGaAs) is grown at a growth temperature of 750° C., an excellent quantum well can be obtained, but when the well and barrier layers are grown at the same growth temperature of 750° C., the well layers are constructed to form quantum wires.

In the second embodiment, as quantum wires are fabricated by MOCVD using a (110) vicinal substrate whose inclination direction is the [00$\bar{1}$] direction, multiatomic steps having step edges formed along the longitudinal direction of the wire with improved linearity can be fabricated, and thus quantum wires can be fabricated with good controllability.

Moreover, quantum wires and quantum wells can be fabricated separately by utilizing the fact that the temperature at which step size variation, i.e., formation of the steps during growth, remarkably occurs, differs between GaAs and AlGaAs. Thus quantum wires and quantum wells can be fabricated quantitatively and efficiently.

Embodiment. 3

Figure 7B:
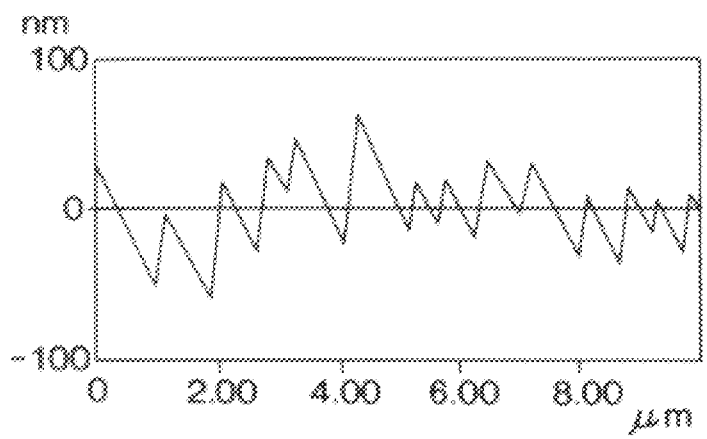
FIG. 7($a$) is a microphotograph of a substrate surface formed by a method of fabricating a semiconductor device according to a third embodiment of the present invention, FIG. 7($b$) is a graph of profile observation indicating a state of step heights, and FIGS. 7($c$) and 7($d$) are diagrams showing results of observation by atomic force microscopy (AFM).
Figure 7C:
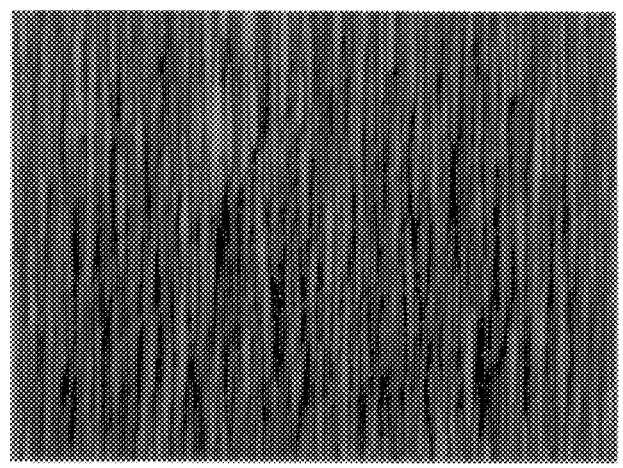
Figure 7D:
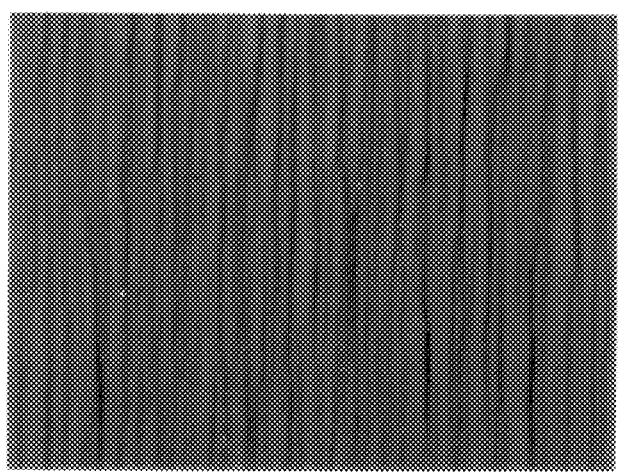

FIGS. 7(a) to 7(d) are diagrams for explaining a method of fabricating a semiconductor device according to a third embodiment of the present invention. FIG. 7(a) is a microscopy image of a substrate surface indicating a result of atomic force microscope (AFM) observation for a sample having a (110) GaAs substrate inclined 2° toward the [00$\bar{1}$] direction, which has been etched using a mixture of HCl, AsH$_3$, and H$_2$ at 750° C. at a pressure of 10 Torr. FIG. 7(b) is a graph based on profile observation indicating the step heights of the formed multiatomic steps, and FIGS. 7(c) and 7(d) are microphotographs of substrate surfaces indicating results of microscopy observation for the sample. As for the flow rates of the respective etching gasses, the flow rate of HCl is $2\times10^{-4}$ l/min, the flow rate of AsH$_3$ is $9\times10^{-5}$ mol/min, and the flow rate of H$_2$ is 2.5 l/min.

From FIG. 7(a), a plan view, it is apparent that the linear step edges are formed on a (110) GaAs substrate inclined 2° toward the [00$\bar{1}$] direction. Moreover, from the graph based on profile observation of FIG. 7(b), it is found that multiatomic steps with step heights from about 30 to 80 nm are formed. As the variation in step height ranges within 10 μm and the variation for the reference value (0 nm) is 50 nm at the maximum, it can be said that multiatomic steps having extremely uniform height are formed. Moreover, it is evident from FIGS. 7(c) and 7(d) that step edges are fabricated in the longitudinal direction of the wire with improved linearity.

From the above results, we can understand that the gas etching has a mechanism which is a reverse of the growth process steps. To be more specific, the step sizes of the multiatomic steps can be controlled by controlling gas etching skillfully, and this can be applied to quantum wires.

Figure 8:
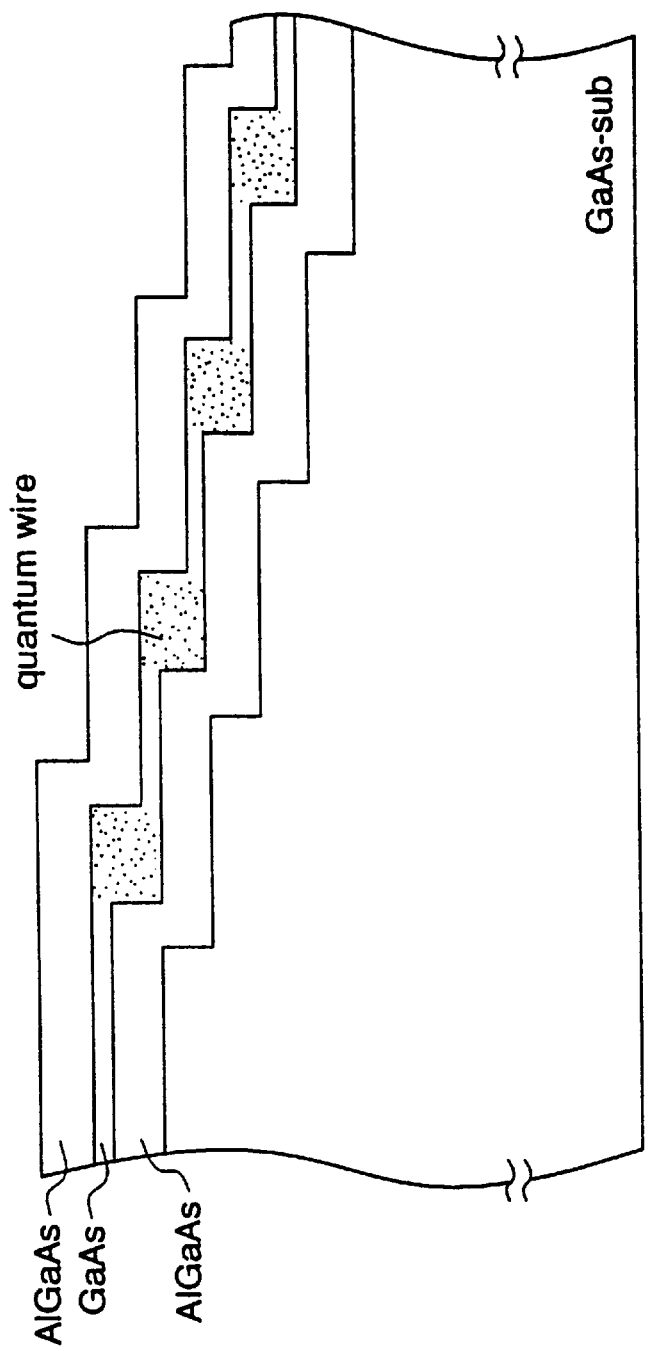
FIG. 8 is a cross-sectional view showing structures of quantum wires formed by a method of fabricating a semiconductor device according to the third embodiment.

A description is given of a process of fabricating quantum wires. Initially, a (110) GaAs substrate inclined 2° toward the [00$\overline{1}$] direction is gas-etched at 750° C. to form multi-atomic steps. Then, an AlGaAs barrier layer, a GaAs well layer, and an AlGaAs well layer are successively formed at 750° C. to produce quantum wires shown in FIG. 8.

Thus, according to the third embodiment, a mechanism which is the reverse of the crystal growth processes is realized by etching a (110) GaAs substrate inclined 2° toward the [00$\overline{1}$] direction using a mixture of gas comprising HCl, AsH$_3$, and H$_2$ at the same temperature and pressure, and by taking advantage of this phenomenon, the step sizes of the multiatomic steps can be controlled and thus quantum wires having reduced variation in step height and improved linearity can be formed in the longitudinal direction.

Embodiment. 4

Figure 9:
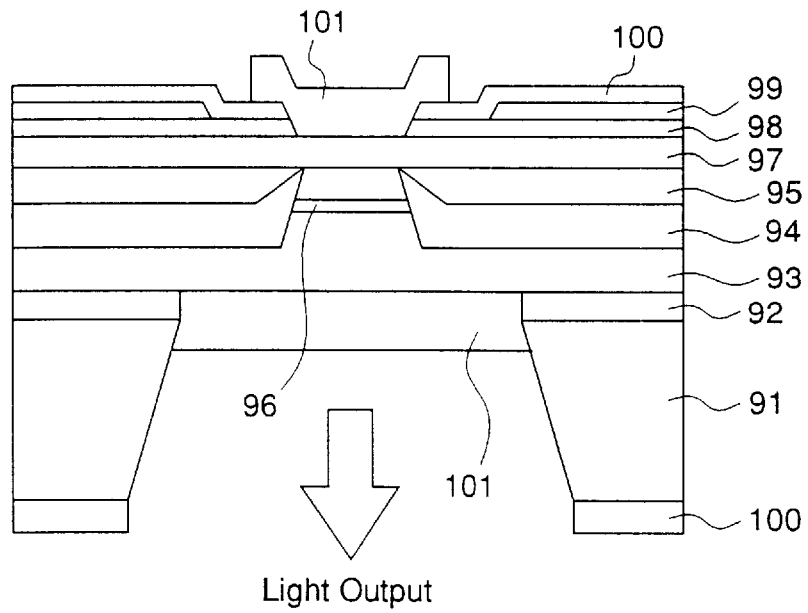
FIG. 9($a$) and 9($b$) are diagrams illustrating structures of semiconductor devices according to a fourth embodiment of the present invention.
Figure 9:
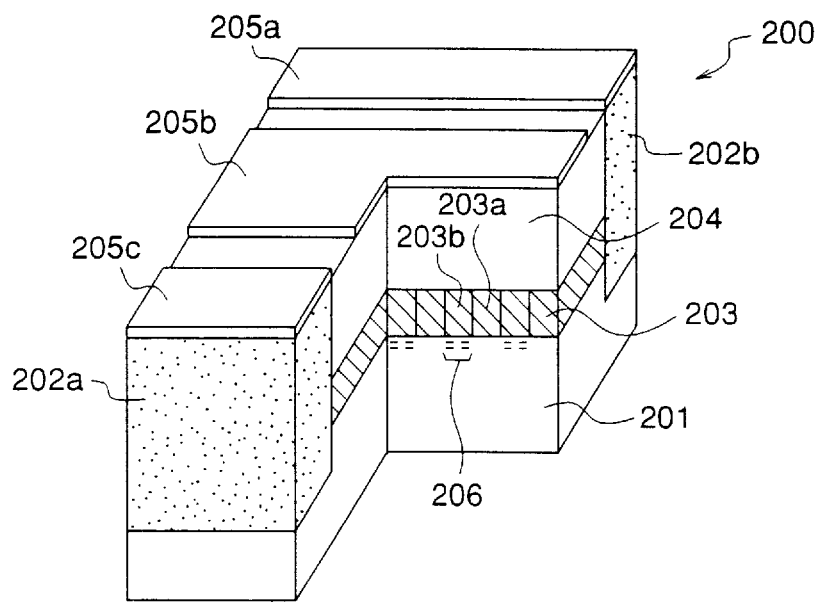
Figure 10:
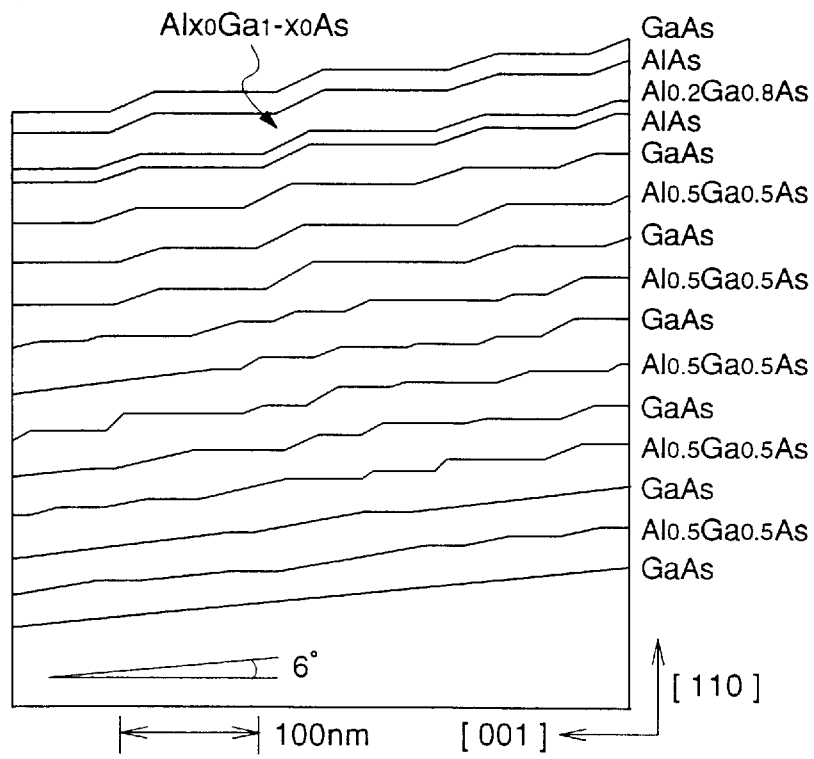
FIG. 10($a$) and FIG. 10($b$) are a cross-sectional view and a top view, respectively, for explaining a prior art method of fabricating self-organized quantum wires.
Figure 10:
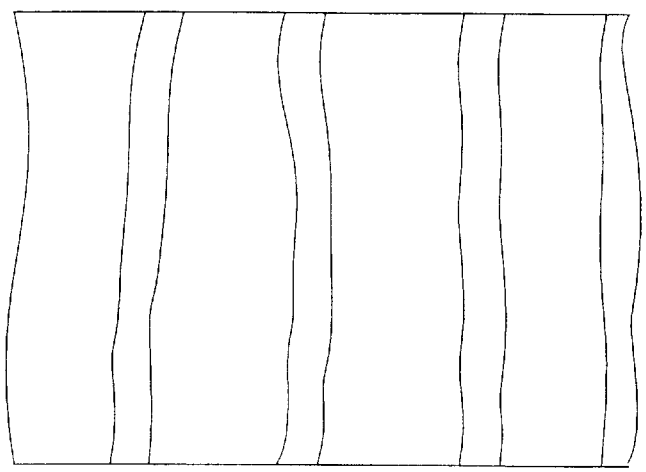
Figure 11:
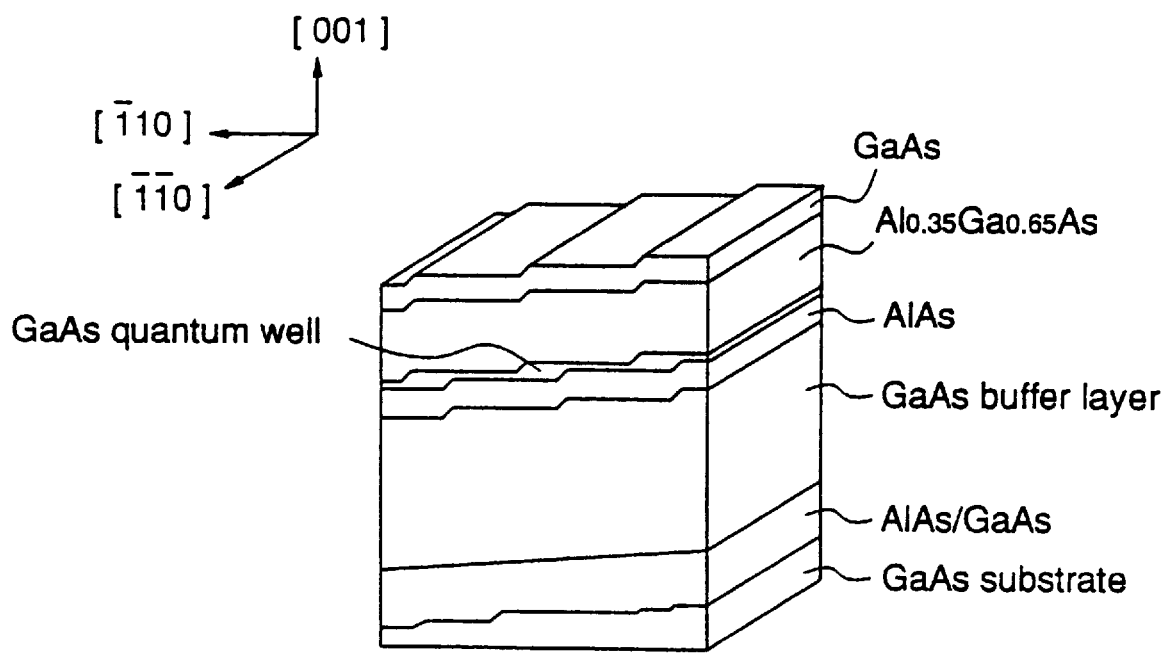
FIG. 11 is a cross-sectional view illustrating a structure of quantum wires formed by an other conventional method of fabricating quantum wires.

FIGS. 9(a) and 9(b) show examples of semiconductor devices comprising quantum wires fabricated by the methods of fabricating a semiconductor device according to the first to third embodiments, and FIG. 9(a) shows an example in which the quantum wires are applied to an active layer of a surface-emitting laser. In FIG. 9(a), reference numeral 91 designates a p type GaAs substrate, numeral 92 designates a p type GaAs buffer layer disposed on the p type GaAs substrate 91, numeral 93 designates a p type AlGaAs lower cladding layer, numeral 94 designates an n type GaAs embedding layer, numeral 95 designates a p type GaAs embedding layer, and these embedding layers 94 and 95 constitute a current block layer. Reference numeral 96 designates quantum wires fabricated by MOCVD in the fabrication method according to any of the above embodiments with a (110) vicinal substrate with an inclination direction toward the [00$\overline{1}$] direction or the [1$\overline{11}$] direction. Reference numeral 97 designates an n type AlGaAs upper cladding layer disposed on the current blocking layer, numeral 98 designates an n type GaAs contact layer disposed on the n type AlGaAs upper cladding layer 97, numeral 99 designates an insulating film comprising SiO$_2$ on the n type GaAs contact layer 98, numeral 100 designates AuGe layers to be coupled with the p type GaAs substrate 91 and the n type GaAs contact layer 98 and serving as electrodes, and numeral 101 designates antireflection films comprising, for example, alternatingly laminated Al$_2$O$_3$ and SiO$_2$ disposed on exposed substrate surfaces which are aligned above or below the active layer 96. Thus, when the active layer of the surface-emitting laser has the above-described quantum wire structure, a low current threshold surface-emitting laser is realized.

FIG. 9(b) is a diagram illustrating a quantum wire FET which is the other example of the semiconductor devices having quantum wires fabricated using the fabrication methods according to any of the first to third embodiments. In the figure, reference numeral 200 designates a quantum wire FET, numeral 201 designates a GaAs substrate, numerals 202a and 202b designate an n$^+$ type GaAs source layer and an n$^+$ type GaAs drain layer, respectively, and they are disposed in prescribed regions on the GaAs substrate 201. Reference numeral 203 designates quantum wires fabricated by MOCVD in a fabrication method according to any of the aforesaid embodiments with a (110) vicinal substrate, having an whose inclination direction in the [00$\overline{1}$] direction or the [1$\overline{11}$] direction. The quantum wires are disposed on the GaAs substrate between the n$^+$ type GaAs source layer 202a and the n$^+$ type GaAs drain layer 202b and each wire is comprised of alternating GaAs layer 203a and AlGaAs layer 203b. The quantum wires are formed so that the respective stripes are between the n$^+$ type GaAs source layer 202a and the n$^+$ type GaAs drain layer 202b. Reference numeral 204 designates a silicon-doped AlGaAs layer, numerals 205a, 205b, and 205c designate a source electrode, a gate electrode, and a drain electrode, respectively, which are disposed on the n$^+$ type GaAs source layer 202a, the silicon-doped AlGaAs layer 204, and the n$^+$ type GaAs drain layer 202b, respectively. Reference numeral 206 designates a two-dimensional gas formed below the active layer 203 comprising the quantum wires.

Thus, as the active layer comprises the above-described quantum wire structure in the FET, mobility is improved by controlling elastic scattering, thereby realizing a very-high-speed device.

While in any of the embodiments the inclination angle of the vicinal substrate is 2° or 6°, an 8-degree slant can be applied to the substrate to provide the above effects.

What is claimed is:

1. A method of fabricating a semiconductor device including:

growing by metalorganic chemical deposition a first compound semiconductor layer on a semiconductor substrate with a nominal (110) surface, inclined at an angle toward to [00$\overline{1}$] direction or the [1$\overline{11}$] direction, so that the first compound semiconductor layer has multi-atomic steps; and growing on the surface of the first compound semiconductor layer at least one double heterostructure comprising a first compound semiconductor and a second compound semiconductor having a smaller band gap energy than the first compound semiconductor, to form quantum wires comprising the second compound semiconductor located at edges of the multiatomic steps.

2. The method of fabricating a semiconductor device defined in claim 1 wherein the first compound semiconductor comprises Al$_x$Ga$_{1-x}$As and the second compound semiconductor comprises GaAs.

3. The method of fabricating a semiconductor device defined in claim 1 wherein the first compound semiconductor comprises Al$_x$Ga$_{1-x}$As and the second compound semiconductor comprises Al$_y$Ga$_{1-y}$As (x>y).

4. The method of fabricating a semiconductor device defined in claim 1 wherein the first compound semiconductor is grown at a first growth temperature so that no difference is step size occurs, and the second compound semiconductor is grown at the edges of the multiatomic steps comprising the first compound semiconductor at a second temperature at which there is a step size difference.

5. A method of forming a quantum well structure including a well layer and at least one barrier layer on a compound semiconductor substrate with a nominal (110) surface inclined toward the [00$\overline{1}$] direction or the [1$\overline{11}$] direction, the method including growing a well layer on the surface of the semiconductor substrate at a first growth temperature and subsequently growing an AlGaAs barrier layer on the well layer at a temperature about 50° C. higher than the first growth temperature.

6. A method of fabricating a semiconductor device including:

gas etching a semiconductor substrate with a nominal (110) surface inclined at an angle toward the [00$\bar{1}$] direction to form multiatomic steps on the surface; and growing by metalorganic chemical vapor deposition on the gas etched surface of the semiconductor substrate at least one double heterostructure comprising a first compound semiconductor and a second compound semiconductor having a band gap energy smaller than the first compound semiconductor to form quantum wires comprising the second compound semiconductor located at edges of the multiatomic steps.

7. A semiconductor device including a semiconductor substrate with a nominal (110) surface inclined at an angle toward the [00$\bar{1}$] direction or the [1$\bar{1}\bar{1}$] direction, at least one double heterostructure including quantum wires disposed on the surface of the semiconductor substrate, the double heterostructure comprising a first compound semiconductor and a second compound semiconductor having a smaller band gap energy than the first compound semiconductor.

* * * * *